(12) United States Patent
Kim et al.

(10) Patent No.: US 10,663,540 B2
(45) Date of Patent: May 26, 2020

(54) MAGNETIC RESONANCE IMAGING (MRI) APPARATUS SIGNAL RECEIVING COIL INCLUDING SUPPORT MEMBER AND COIL ELEMENT CONNECTED TO SUPPORT MEMBER

(71) Applicant: SAMSUNG ELECTRONICS CO., LTD., Suwon-si (KR)

(72) Inventors: Young Beom Kim, Yongin-si (KR); Yeunchul Ryu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 552 days.

(21) Appl. No.: 14/836,318

(22) Filed: Aug. 26, 2015

(65) Prior Publication Data
US 2016/0084926 A1 Mar. 24, 2016

(30) Foreign Application Priority Data
Sep. 19, 2014 (KR) .......................... 10-2014-0124902

(51) Int. Cl.
*G01R 33/3415* (2006.01)
*G01R 33/34* (2006.01)

(52) U.S. Cl.
CPC ... *G01R 33/3415* (2013.01); *G01R 33/34046* (2013.01)

(58) Field of Classification Search
CPC .............. G01R 33/34; G01R 33/34046; G01R 33/3415; G01R 33/385; G01R 33/481; G01R 33/546
See application file for complete search history.

(56) References Cited

U.S. PATENT DOCUMENTS

| | | | | |
|---|---|---|---|---|
| 4,712,068 | A * | 12/1987 | Savelainen | G01R 33/34046 324/318 |
| 5,602,479 | A * | 2/1997 | Srinivasan | G01R 33/34046 324/318 |
| 5,933,007 | A * | 8/1999 | Schommer | G01R 33/341 324/318 |
| 6,236,206 | B1 * | 5/2001 | Hartman | G01R 33/3628 324/300 |
| 6,762,606 | B2 * | 7/2004 | Jevtic | G01R 33/34046 324/318 |
| 6,812,701 | B2 * | 11/2004 | Seeber | G01R 33/34046 324/318 |
| 2002/0079996 | A1 | 6/2002 | Zhang et al. | |

(Continued)

FOREIGN PATENT DOCUMENTS

| JP | 2011-056164 A | 3/2011 |
|---|---|---|
| JP | 2014-0042685 A | 8/2012 |

(Continued)

OTHER PUBLICATIONS

English Translation of KR 20020093427A.*

*Primary Examiner* — Jay Patidar
(74) *Attorney, Agent, or Firm* — NSIP Law

(57) ABSTRACT

A receiving coil for a magnetic resonance imaging (MRI) apparatus has a cylindrical form including ring-type support members or a cylinder-type support member having open ends, and at least one coil element connected to the support member(s). The receiving coil is configured to receive magnetic resonance signals.

4 Claims, 19 Drawing Sheets

(56) References Cited

U.S. PATENT DOCUMENTS

| | | | |
|---|---|---|---|
| 2003/0020476 A1* | 1/2003 | Duensing | G01R 33/34046 324/318 |
| 2003/0080740 A1* | 5/2003 | de Swiet | G01R 33/34046 324/318 |
| 2004/0075437 A1* | 4/2004 | Srinivasan | G01R 33/34046 324/318 |
| 2004/0183534 A1 | 9/2004 | Chan et al. | |
| 2004/0189304 A1* | 9/2004 | Anderson | G01R 33/34046 324/322 |
| 2005/0059882 A1* | 3/2005 | Tropp | A61B 5/055 600/422 |
| 2009/0099444 A1* | 4/2009 | Bogdanov | G01R 33/34046 600/422 |
| 2010/0141259 A1 | 6/2010 | Graesslin et al. | |
| 2010/0244836 A1 | 9/2010 | Hollis | |
| 2012/0268132 A1 | 10/2012 | Zhu et al. | |
| 2014/0125339 A1* | 5/2014 | Lee | G01R 33/3415 324/319 |
| 2014/0125342 A1 | 5/2014 | Bovier et al. | |

FOREIGN PATENT DOCUMENTS

| | | |
|---|---|---|
| KR | 10-2002-0093427 A | 12/2002 |
| KR | 10-2012-0015580 A | 2/2012 |

* cited by examiner

260

260

260

260

260

260

260

MAGNETIC RESONANCE IMAGING (MRI) APPARATUS SIGNAL RECEIVING COIL INCLUDING SUPPORT MEMBER AND COIL ELEMENT CONNECTED TO SUPPORT MEMBER

CROSS-REFERENCE TO RELATED APPLICATION(S)

This application claims the benefit under 35 USC 119(a) of Korean Patent Application No. 10-2014-0124902, filed on Sep. 19, 2014, in the Korean Intellectual Property Office, the entire disclosure of which is incorporated herein by reference for all purposes.

BACKGROUND

1. Field

The following description relates to a coil for receiving a signal, and more particularly, to a coil receiving a signal for use in a magnetic resonance imaging (MRI) apparatus.

2. Description of Related Art

Various diagnostic apparatuses are used to diagnose symptoms to prevent or cure diseases. Among the diagnostic apparatuses, an MRI apparatus providing a magnetic field generated by a magnetic force are commonly used to diagnose symptoms, among other things.

The MRI apparatus includes elements that apply a high frequency signal to a biological tissue to prompt a resonance effect from the biological tissue. In addition, the MRI apparatus includes elements that apply gradient signals to the biological tissue to acquire spatial information associated with the biological tissue. The MRI apparatus may be used to acquire an internal body structure image and 1) verify a normal cell or tissue and 2) verify an abnormal cell or tissue.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, In one aspect, a magnetic resonance imaging (MRI) receiving coil includes: a first support member forming a ring around a central axis; a second support member, forming a ring around the central axis; and at least one coil element connected between the first support member and the second support member along a surface of a right circular virtual cylinder formed around the central axis between the first support member and the second support member.

The at least one coil element may have a helical shape where a tangent line at any point on the at least one coil element forms a constant angle with the central axis.

The at least one coil element, the first support member, and the second support member may be formed of the same material.

The MRI receiving coil also may include a first capacitor forming the connection between the at least one coil element and the first support member; and a second capacitor forming the connection between the at least one coil element and the second support member.

The at least one coil element may connect a first point of the first support member and a second point of the second support member, and the first point and the second point may be spaced apart where a straight line parallel to the central axis intersecting the first point does not intersect the second point.

The at least one coil element may be formed of a conducting material.

The MRI receiving coil also may include a plurality of the at least one coil elements wherein the plurality of coil elements may be electrically insulated from one another.

The plurality of the at least one coil elements may connect the first support member and the second support member at a predetermined interval, wherein the predetermined interval is a distance between the plurality of the at least one coil elements.

In addition, the plurality of at least one coil elements also may be a first coil element connected to the first point and the second point and a second coil element connected to the first point and a third point, the third point and second point being symmetrical to one another in a planar area formed by area surrounded by the second side surface and perpendicular to the central axis. In addition, plurality of the at least one coil elements also may be a first coil element connected between the first support member and the second support member, and a second coil element connected between the first support member and the second support member may symmetrically cross the first coil element on the surface of the virtual cylinder.

The plurality of the at least one coil elements may include a first coil element connected between the first support member and the second support member, and a second coil element connected between the first support member and the second support member may symmetrically cross the first coil element on the surface of the virtual cylinder and the first coil element and second coil element may be orthogonal to each other at the crossing.

In addition, the plurality of the at least one coil elements may include a first coil element and a second coil element, where the first coil element and the second element may be symmetrical to each other with respect to the central axis. Furthermore, the plurality of the at least one coil elements further may include a third coil element and a fourth coil element, and each of the third coil element and the fourth coil element are disposed between the first coil element and the coil second element on the surface of the virtual cylinder where the third coil element and the fourth coil element may be symmetrical to each other with respect to the central axis.

In another general aspect, a magnetic resonance imaging (MRI) receiving coil includes: a support member comprising an open ended circular cylinder wall formed at a right angle around a central axis of the support member, the wall having a first circular side surface at one end of the cylinder and a second circular side surface at the opposite end of the cylinder; and at least one coil element connected a first point of the first side surface of the support member and a second point of the second side surface of the support member passing across the wall of the support member.

The first point and the second point may be spaced apart and a straight line parallel to the central axis of the support member intersecting the first point does not intersect the second point.

The at least one coil element may be a helical shape where a tangent line at any point on the at least one element forms a constant angle with the central axis.

The MRI receiving coil also may include plurality of the at least one coil elements, wherein the plurality of at least one coil elements are electrically insulated from one another.

The plurality of at least one coil elements may connect the first support member and the second support member at a predetermined interval, wherein the predetermined interval is a distance between the plurality of the at least one coil elements.

The plurality of at least one coil elements also may include a first coil element connected to the first point and the second point and a second coil element connected to the first point and a third point, the third point and second point being symmetrical to one another in a planar area formed by area surrounded by the second side surface and perpendicular to the central axis.

The plurality of at least one coil elements also may include a first coil element connected between the first side surface and the second side surface and a second coil element connected between the first side surface and the second side surface symmetrically crossing cross the first coil element on the wall of the support member.

The plurality of at least one coil elements also may include a first coil element and a second coil element, and the first coil element and the second coil element are symmetrical to each other with respect to the central axis of the support member.

The plurality of at least one coil elements may include a first coil element connected between the first side surface and the second side surface and a second coil element connected between the first side surface and the second side surface may symmetrically cross the first coil element on the wall of the support member and the first coil element and second coil element may be orthogonal to each other at the crossing.

The plurality of elements may include a first element and a second element, the first element configured to connect the first point and the second point, and the second element symmetrical to the first element with respect to a central axis of the support member.

Other features and aspects will be apparent from the following detailed description, the drawings, and the claims.

Figure 1:
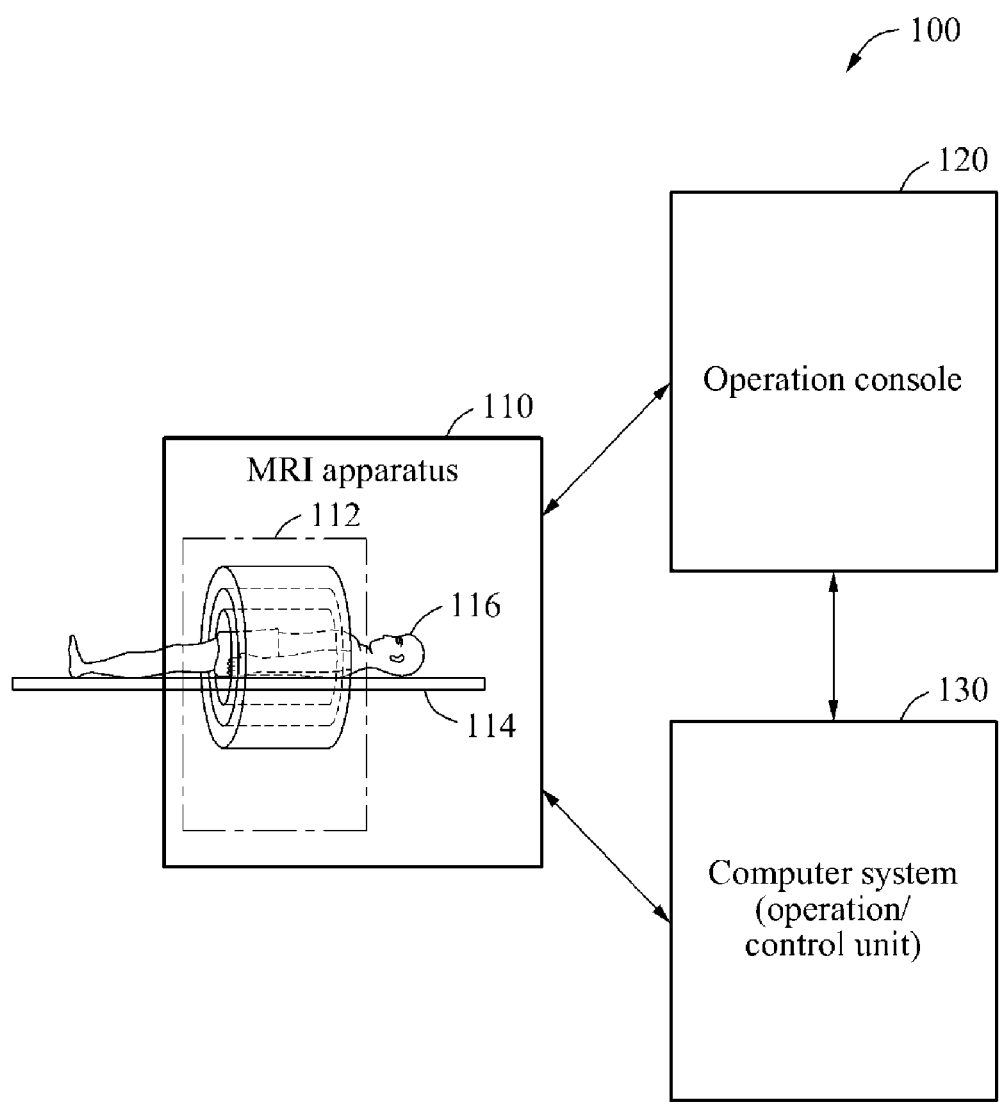
FIG. 1 is a block diagram illustrating an example of a magnetic resonance imaging (MRI) system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

Hereinafter, exemplary embodiments are described in detail with reference to the accompanying drawings, wherein like reference numerals refer to like elements throughout.

Various alterations and modifications may be made to the exemplary embodiments, some of which are illustrated in detail in the drawings and detailed description. However, it should be understood that these embodiments are not construed as limited to the illustrated forms and include all changes, equivalents or alternatives within the idea and the technical scope of this disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It is further understood that terms, such as those defined in commonly used dictionaries, should be interpreted as having a meaning that is consistent with their meaning in the context of the relevant art as described herein and should not be interpreted out of such context unless expressly so defined herein.

Like reference numerals in the drawings denote like elements, and redundant descriptions of like elements are normally omitted herein in the interested of conciseness and clarity. When it is determined a detailed description of a related known function or configuration unnecessarily complicates this detailed description, that description is omitted.

FIG. 1 illustrates an overall configuration of a magnetic resonance imaging (MRI) system 100.

The MRI system 100 includes an MRI apparatus 110, an operation console 120, and a computer system 130. In one example, the computer system may be an operation/control unit. Although not shown in FIG. 1, elements included in the MRI system 100 may be partially integrated in lieu of being physically separated from one another.

The MRI apparatus 110 receives a control signal for generating an MRI from the operation console 120 and performs an operation based on the received control signal. The MRI apparatus 110 acquires a magnetic resonance signal used for generating the MRI from an object 116 located on a support 114 within a magnet system 112. The MRI apparatus 110 outputs an image signal generated based on the magnetic resonance signal to the computer system 130. The generated image signal may include digital data.

The computer system 130 receives the generated image signal from the MRI apparatus 110. The computer system 130 may generate an MRI with respect to a predetermined area of the object 116 by reconfiguring the received image signal. The computer system 130 transfers the generated MRI to the operation console 120.

The computer system 130 includes an image processing device (not shown), a storage device (not shown), and an interface (not shown). The processing device is configured to receive the image signal generated based on the magnetic resonance signal and generate the MRI by reconfiguring the image signal. The storage device is configured to store the generated MRI and the received image signal. The interface is configured to provide a connection between the MRI apparatus 110 and the operation console 120.

The operation console 120 receives the generated MRI from the computer system 130. In one example, the operation console 120 may include a number of components including a monitor (not shown), input devices (not shown), and a panel (not shown). The monitor is configured to display the received MRI. The input devices may include, for example, a keyboard and a mouse, and are configured to receive control information from a user. The panel is configured to indicate a state and a condition of scanning.

In an example, the MRI system 100 may be implemented as a hybrid MRI system in combination with a different medical imaging device, such as, for example, a position emission tomography (PET).

Figure 2:
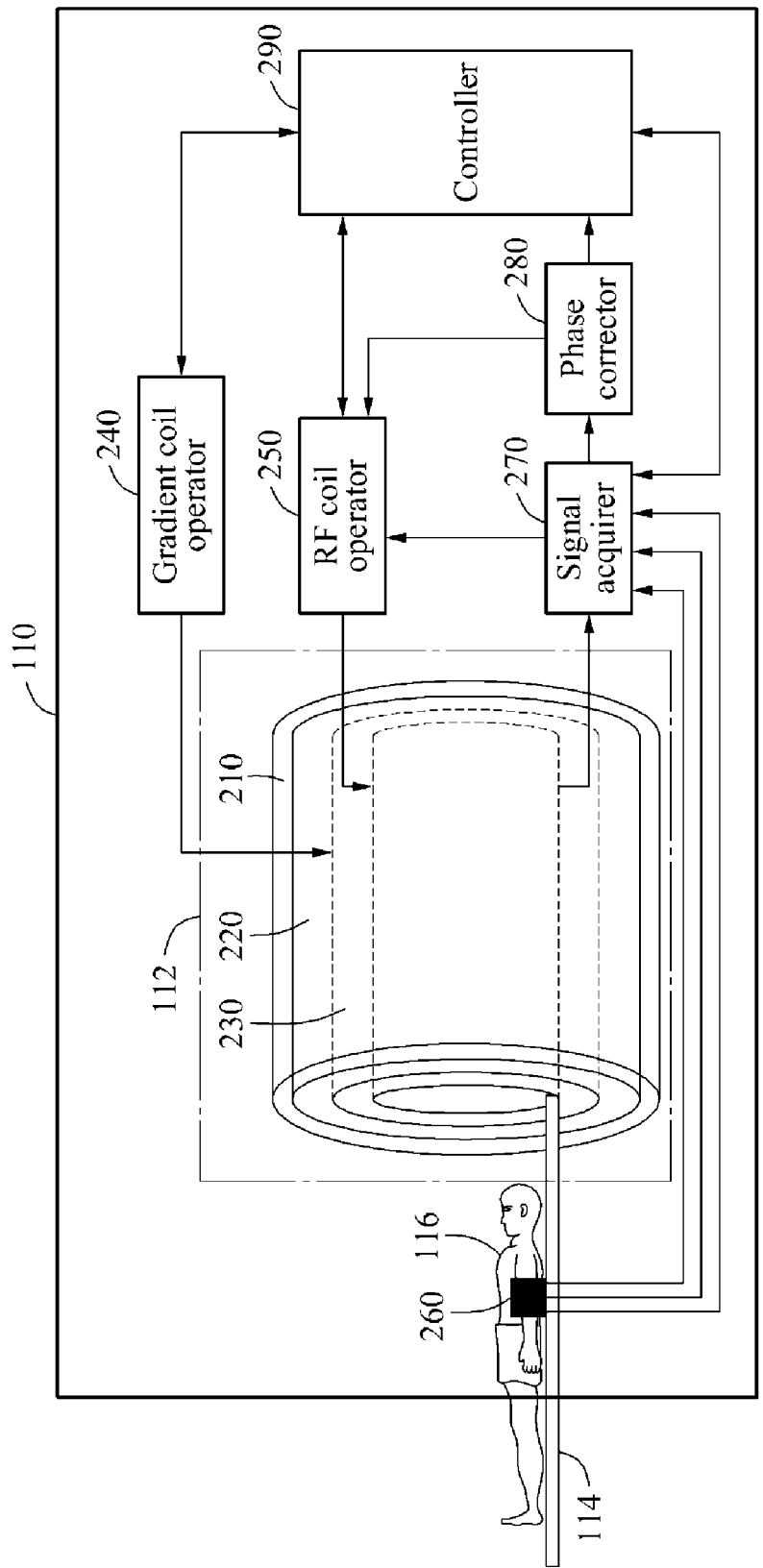
FIG. 2 is a block diagram illustrating an example of an MRI apparatus.

FIG. 2 illustrates one example of a configuration of the MRI apparatus 110. As shown in FIG. 2, the MRI apparatus 110 includes the magnet system 112. As shown in the example provided in FIG. 2, the magnet system 112 includes a main magnet 210, a gradient coil unit 220, and an RF coil unit 230. The MRI apparatus also includes, a gradient coil operator 240, a radio frequency (RF) coil operator 250, a receiving coil 260, a signal acquirer 270, a phase corrector 280, and a controller 290.

The magnet system 112 may further include a high frequency shield (not shown) disposed between the gradient coil operator 240 and the RF coil operator 250. The high frequency shield is configured to block a high frequency occurring in the RF coil operator 250.

Although FIG. 2 illustrates the MRI apparatus 110 as including components relating to the examples described herein, it is understood, by those skilled in the art related to MRI systems, that various other common elements related to an MRI apparatus also may be included in the MRI apparatus 110 in addition to those components illustrated in FIG. 2.

In the example illustrated in FIG. 2, all of components including the gradient coil operator 240, the RF coil operator 250, the signal acquirer 270, the phase corrector 280, and the controller 290 of the MRI apparatus may be implemented by a single processing device. In another example, each of the components (e.g., 240, 250, 270, 280, and 290) may be implemented by a single processing device. In yet another example, two or more of the components (e.g., 240, 250, 270, 280, and 29) may be implemented by a single processing device.

The main magnet 210 may form a static magnetic field in an internal space of the magnet system 112 in a direction that is relative to an axis of the body of the object 116. For example, the direction of the static magnetic field may be parallel to a longitudinal axis of the object 116. As another example, the direction of the static magnetic field may be perpendicular to the longitudinal axis of the object 116.

At least one of a permanent magnet, a resistive magnet, and a super conductive magnet may be used to implement the main magnet 210. In one example, a super conductive magnet used to implement the main magnet 210 may generate a magnetic field greater than or equal to 0.5 teslas (T).

The following examples assume use of a super conductive magnet as the magnet 210 to form a horizontal static magnetic field parallel to a direction relative to the body axis of the object 116.

For example, when a super conductive magnet is used as the main magnet 210 in the configuration shown in FIG. 2, the gradient coil unit 220 and the RF coil unit 230 are arranged according to a coaxial relationship with a central axis. For example, the main magnet 210, the gradient coil unit 220, and the RF coil unit 230 may be sequentially arranged in order from furthest to closest to the central axis, as shown in FIG. 2.

The RF coil unit 230 may be structured to provide an empty space such that the object 116 may be located within the RF coil unit. For example, when the object 116 is located on the support 114, and the support 114 is moved into the magnet system 112, a magnetic field and an RF pulse can be applied to the object 116.

The gradient coil unit 220 forms a gradient field in relation to the object 116 in directions relative to three axes perpendicular to one another. When an RF signal having a Larmor frequency is applied to the object 116 for which the static magnetic field is formed, groups of magnetic resonance signals having similar properties may be output concurrently. As a result, a source and a corresponding signal output from the source are indistinguishable.

However, the gradient field may be used to identify the source and the corresponding signal output from the source. By using the gradient field in which a magnetic field distribution and the Larmor frequency based on the magnetic field distribution be linearly varied to correspond to a space. For example, a hydrogen atomic nuclei in a predetermined area of the object 116, corresponding to an area of interest, may be selectively resonated.

The three axes perpendicular to one another may be used to indicate a slice axis, a frequency axis, and a phase axis. When the three axes correspond to an x axis, a y axis, and a z axis in an internal space in which the static magnetic field is formed, any one of the x axis, the y axis, and the z axis may be used as the slice axis. As a result, the two of the remaining axes, for example, the x axis, the y axis, and the z axis, may be used as the frequency axis and the phase axis. The slice axis may be set in a direction slanted at a constant angle relative to the body axis of the object 116.

The gradient coil unit 220 may form three different gradient fields in directions relative to the x axis, the y axis, and the z axis. The gradient fields may be formed along the body axis of the object 116 as a precondition for selectively exciting a predetermined cross section perpendicular to the body axis of the object 116. A slice selection gradient may be applied to form the gradient fields. Also, a frequency encoding gradient and a phase encoding gradient may be applied to acquire two-dimensional (2D) space information from a plane selected to form the gradient fields. The gradient coil unit 220 may have three types of gradient coils to form the gradient fields in directions relative to the slice axis, the frequency axis, and the phase axis.

The gradient coil unit 220 enables the magnetic resonance signal to be expressed in a spatial frequency domain, for example, a k-area, by spatially controlling a rotation frequency or a phase of a magnetization vector when the magnetization vector rotates on a transverse plane.

The gradient coil operator 250 is connected to the gradient coil unit 220 to provide a signal to the gradient coil unit 220 to form a gradient field. The gradient coil operator 250 may include a gradient operating circuit that corresponds to each of the three types of gradient coils for the slice axis, the frequency axis, and the phase axis. The gradient coil operator 250 also may include a waveform synthesizer (not shown) and an RF amplifier (not shown).

In one example, an RF signal is applied to an object to acquire a magnetic resonance signal from the object, and the magnetic resonance signal is generated in response to the applied RF signal. As shown in FIG. 2, the RF coil unit 230 may apply RF signals to the object 116 and acquire the magnetic resonance signals generated in the object 116. For example, the RF coil unit 230 performs the functions of applying the RF signals and acquiring the magnetic resonance signals. The RF coil unit 230 may be implemented using a transceiver coil to apply the RF signals and acquire the magnetic resonance signals. For example, the transceiver coil may be implemented using a strip-line-shaped coil or a transverse electromagnetic mode (TEM) coil. However, other types of coils and configurations may be used to implement the RF coil unit 230. For example, the RF coil unit 230 may include one coil to apply the RF signals or include another coil to acquire the magnetic resonance signals. In another example, the transceiver coil may be implemented using a multichannel coil, which is known by those skilled in the art and therefore further descriptions are omitted in the interest of conciseness and clarity.

In one example, the RF coil unit 230 receives RF signals generated by the RF coil operator 250 and applies the RF signal to the object to excite the hydrogen atomic nuclei of the object 116. The RF coil unit 230 may acquire electric waves that occur when the excited hydrogen atomic nuclei of the object 116 return to a stable state. The acquired electric waves correspond to the magnetic resonance signal.

To enable an MRI generated in the MRI system 100 to equally and clearly indicate information about the object 116, the RF coil unit 230 can apply a frequency magnetic field, such as, for example, a B1 magnetic field having an equalized magnitude. The state of a B1 magnetic field may be unequal due to influences, such as, for example, ambient magnetic materials or an internal structure of the transceiver coil. As a result, B1 magnetic field shimming may be used to equalize the B1 magnetic field when the B1 magnetic field is in the unequal state.

The RF coil operator 250 may generate and output RF signals, for example, an RF pulse and an RF pulse sequence, that are applied by the RF coil unit 230. The RF coil operator 250 may include an RF oscillator (not shown) configured to oscillate an RF pulse, a phase shifter (not shown) configured to perform a phase transition, a waveform synthesizer (not shown) configured to form an appropriate type of RF pulse sequence, a modulator (not shown) configured to modulate the RF pulse sequence, and an RF amplifier (not shown) configured to amplify RF pulses.

In one example, the RF coil operator 250 determines an operation mode of the RF coil unit 230. For example, the RF coil operator 250 may determine one of a plurality of operation modes of the RF coil unit 230 including: 1) a Tx-Rx mode for applying RF signals to and acquiring magnetic resonance signals generated in the object 116, 2) a Tx-mode for applying RF signals to the object 116, an 3) an Rx mode for acquiring magnetic resonance signals generated in the object 116.

When the RF coil unit 230 operates in the Tx-Rx mode or the Rx-mode, the RF coil operator 250 may transmit a signal requesting that the RF coil unit 230 provide the acquired magnetic resonance signals to the signal acquirer 270.

The RF coil unit 230 may be configured using an array structure, for example, a pTx array that corresponds to multiple slices or multiple volumes of an examination area of the object 116. The array structure may include a plurality of coils arranged in a direction relative to the body axis. The number of volumes is not restricted. The width of an area of a single volume may vary from a submillimeter to tens of centimeters (cm). In one example, the range of widths of the single volume may be 1 millimeter (mm) to 60 cm.

Hereinafter, the following descriptions and examples assume the use of multiple volumes unless otherwise specified. However, a method using the multiple slices is well known by those skilled in the art and therefore omitted in the interest of conciseness.

Each coil of the RF coil unit 230 may apply high frequency pulses to the object 116. The high frequency pulses include a plurality of frequencies to excite at least one of the plurality of volumes concurrently. Each of the high frequency pulses may have an identical or different phase. For example, the range of a frequency applied to the object 116 may be 0 to 128 megahertz (MHz).

The receiving coil 260 may acquire the magnetic resonance signals generated in the object 116 using at least one receiving coil. For example, the receiving coil 260 may acquire the magnetic resonance signals from the plurality of volumes. In one example, a multichannel receiving coil may be used to implement the receiving coil 260. The speed of generating an MRI and an image quality of the MRI may be improved through use of a multichannel receiving coil. The receiving coil 260 transmits the acquired magnetic resonance signals to the signal acquirer 270.

In one example, the receiving coil 260 performs the function of receiving the magnetic resonance signals. In this example, the receiving coil 260 may be positioned on the object 116. However, other positions for the receiving coil 260 may be used.

Descriptions with respect to the receiving coil 260 also are provided with reference to FIG. 3 through FIG. 19.

The receiving coil 260 may be positioned at a predetermined location with respect to the object 116. For example, assuming the object 116 is a patient, when an MRI of the head of the patient is to be acquired, the receiving coil 260 may be positioned in the vicinity of the head of the patient.

The receiving coil 260 may acquire magnetic resonance signals resulting from the RF signals applied to the object 116 by the RF coil unit 230. The receiving coil 260 transmits the acquired magnetic resonance signals to the signal acquirer 270.

In one example, the total intensity of magnetic resonance signals received by the signals acquirer 270 may be increased when the magnetic resonance signals generated in the object 116 are acquired by the receiving coil 260. A greater intensity of magnetic resonance signals are received by the signal acquirer 270 when the magnetic resonance signals are acquired by both the RF coil unit 230 and the receiving coil 260, as compared to the instance when the magnetic resonance signals are acquired by the RF coil unit 230 only.

When the magnetic resonance signals are acquired by the RF coils unit 230 only, the acquired magnetic resonance signals may be distorted due to the space between the object 116 and the RF coil unit 230. By decreasing the distance between the position of receiving coil 260 and the position at which the magnetic resonance signals are generated, the magnetic resonance signal received by the signal acquirer 270 may be less distorted.

The signal acquirer 270 may generate digital data based on the received magnetic resonance signals acquired by the RF coil unit 230 and the receiving coil 260. The signal acquirer 270 may include a preamplifier (not shown) configured to amplify the received magnetic resonance signals, a demodulator (not shown) configured to demodulate the amplified magnetic resonance signals, a low pass filter (LPF) (not shown) configured to remove noise, and an analog-digital converter (ADC) (not shown) configured to convert the demodulated magnetic resonance signals from an analog to a digital form.

In one example, the signal acquirer 270 may select magnetic resonance signals acquired by a predetermined coil from among the magnetic resonance signals acquired by the RF coil unit 230 and the receiving coil 260. For example, the signal acquirer 270 may include a coil selector (not shown) configured to select predetermined coils from among the receiving coils included in the receiving coil 260 and the transceiver coil included in the RF coil unit 230. The signal acquirer 270 may generate digital data based on magnetic resonance signals acquired by the coils selected by the coil selector.

The signal acquirer 270 also may amplify the received magnetic resonance signals using a high frequency amplifier. The signal acquirer 270 may acquire magnetic resonance signals in a base band by demodulating the amplified magnetic resonance signals based on a sine wave of a Larmor frequency. The signal acquirer 270 may quantize the magnetic resonance signals in the base band and transmit the quantized magnetic resonance signals to the computer system 130. The computer system 130 may acquire an MRI based on the quantized magnetic resonance signals.

The MRI system 100 may acquire the MRI based on a scheme, for example, a multiband imaging and a sensitivity encoding (SENSE) parallel imaging.

Any descriptions provided with reference to FIG. 1 above that are also applicable to FIG. 2 are omitted in the interest of clarity and conciseness.

Figure 3:
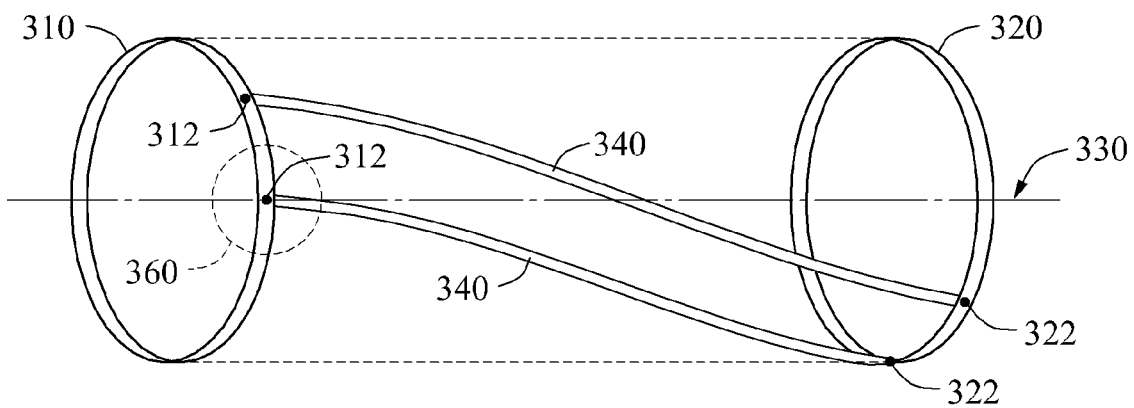
FIG. 3 is a perspective view illustrating an example of a receiving coil provided in a ring-type structure.

FIG. 3 is a perspective view illustrating an example of a receiving coil using a ring-type structure. For example, FIG. 3 illustrates that the receiving coil 260 may be formed in a cylindrical shaped structure using ring-type support members. However, other forms of the receiving coil 260 may be used and the coil 260 is not limited thereto.

As shown in FIG. 3, the receiving coil 260 includes a first support member 310 and a second support member 320 disposed around a central axis 330 and at least one coil element 340. As shown in the example of FIG. 3, two coil elements 340 are provided.

The first support member 310 is arranged in a first plane and the second support member 320 is arranged in a second plane parallel to the first plane forming the bases of a virtual, open, right circular cylinder having a central axis 330 that is perpendicular to the first and second planes and intersects the centers c of the rings forming the support members.

The coil element 340 connects the first support member 310 and the second support member 320. As shown in FIG. 3, there are two coil elements 340. Since the coil elements 340 connect the supporting elements 310 and 320, the receiving coil 260 may be referred to as an array receiving coil.

A description about a structure 360 of the connection between the coil elements 340 and the first support member 310 and the second support member 320 are provided below with reference to FIG. 5.

The coil elements 340 connect a first point 312 of the first support member 310 to a second point 322 of the second support member 320. Additional description about the relationship between the positioning of first point and the second point are provided below with reference to FIG. 6.

The coil element 340 is provided having a helical shape, for example, a tangent line at any point along the coil element forms a constant angle with the central axis 330. The coil element 340 may be formed as a helical shape passing over the surface of the virtual cylinder formed between the first support member 310 and the second support member 320 around the central axis 330.

Since the coil element 340 is provided as helical in shape, the length of the coil element 340 connecting the first support member 310 and the second support member 320 is greater than the length of a coil element (not shown) provided in a straight line between the support members. In addition, increasing the length of a coil element 340 can increase the bandwidth of an RF frequency applied to the object 116.

In addition, by providing coil element 340 as a helical shape, the coil element 340 is not positioned in a direction parallel to an axis of the body 116, and the coil sensitivity may be varied based on a position in the coil element 340. For example, by varying sensitivity of the receiving coil 260 based on the position of the coil element 340, a B field sensitivity may be spatially localized on an imaging plane of a corresponding element for each of the volumes when the magnetic resonance signals received by the element are generated from the volumes concurrently. In addition, the force separating an overlapping signal between neighboring volumes may be increased, in response to using a coil element 340 that varies coil sensitivity based on the position in the coil element.

Accordingly, a magnetic resonance signal may be accurately identified with respect to a plurality of volumes of a predetermined portion for which an MRI is to be generated.

In one example, the coil element 340 may be made from the same material as the first support member 310 and the second support member 320. For example, the first support member 310, the second support member 320, and one or more coil elements 340 may be made from a metal material, such as, for example, copper.

In another example, the coil elements 340 may be made from a material that is different from the first support member 310 and the second support member 320. For example, the coil elements 340 may be made from a metal material, and the first support member 310 and the second support member 320 may be made from a non-metal material.

In one example, each of the coil elements 340 may correspond to a transverse electromagnetic type, such as a strip-line. In another example, each of the coil elements 340 may correspond to a microstrip-line type, such as a microstrip-line. In another example, each of the coil elements 340 may correspond to a loop array type, such as a plurality of loop coils in a longitudinal direction. Each of the strip-line, the microstrip-line, and the loop coils may be a conductor.

Each of the coil elements 340 may be positioned at predetermined intervals to connect the first support member 310 and the second support member 320.

The coil elements 340 connect the first support member and the second support member at a predetermined interval. The predetermined interval is a distance between the coil elements 340. For example, when four coil elements 340 are provided, the four coil elements may be positioned around the circumference of the first support member 310 at equidistant intervals.

Although FIG. 3 illustrates the receiving coil 260 as including two of the coil elements 340, the number of the at least one coil element 340 is not limited thereto, and other number of elements are contemplated.

To the extent that the descriptions provided with reference to FIGS. 1 and 2 are also applicable to FIG. 3, they are not repeated in the interest of conciseness.

Figure 4:
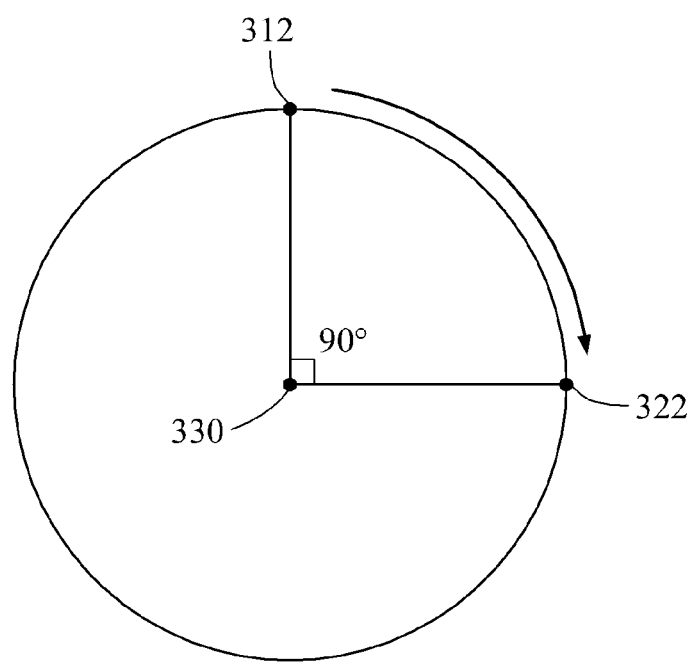
FIG. 4 is an end view illustrating an example of aligning a coil element.

FIG. 4 is an end view illustrating an example of the alignment of a coil element 340. FIG. 4 illustrates the receiving coil 260 of FIG. 3 as viewed from an end of the coil 260 down the central axis 330 of the coil 260 between the first support member 310 and the second support member 320.

As described above, the coil element 340 may connect to the first point 312 and the second point 322. With reference to the central axis 330, an angle between the first point 312, the axis 330, and the second point 322 is 90°. However, other angles may be formed. For example, although not shown, the angle between the first point 312, the axis 330, and the second point 322 may be 180°.

To the extent that the descriptions provided with reference to FIGS. 1 through 3 are also applicable to FIG. 4, they are not repeated in the interest of conciseness.

Figure 5:
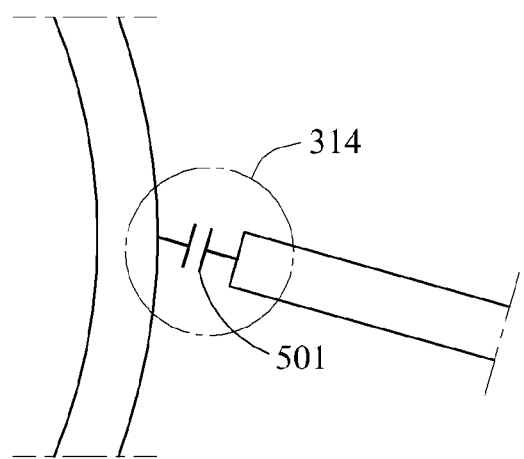
FIG. 5 illustrates an example of the connection of a coil element connected to a support member by using a capacitor.

FIG. 5 illustrates an example of the connection between a support member and a coil element. As shown in FIG. 5, the structure 360 of a connection between the coil element 340 and a support member (e.g., 310 or 320) is provided. A coil element and a point of a support member may be connected by a capacitor 501.

The capacitor 501, may be used, for example, as a decoupling circuit to interrupt a magnetic combination enabling a coil element 340 to operate independently of a neighboring coil element 340.

A multichannel scheme in which each of the RF signals is independently applied by the RF coil unit 230 may be used to operate the coil elements 340. For example, a circuit may be configured in parallel with respect to the at least one coil element 340. A phase and intensity may be controlled independently for each of the magnetic resonance signals received by the at least one coil element 340.

In one example, a portion of the at least one coil element 340 may form a group. For example, the group may be formed such that the received magnetic resonance signals do not affect each other, and the magnetic resonance signals may be received independently for each formed group.

To the extent that the descriptions provided with reference to FIGS. 1 through 4 are also applicable to FIG. 5, they are not repeated in the interest of conciseness.

Figure 6:
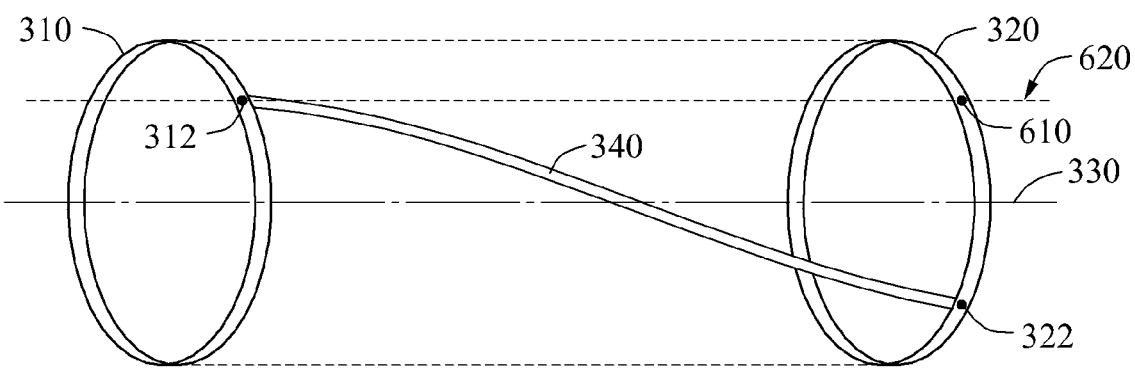
FIG. 6 is a perspective view illustrating an example of a positional relationship among points of a support member.

FIG. 6 is a perspective view that illustrates an example of the positional relationship between points of connection of a support member and a coil member.

The coil element 340 may connect to the first point 312 of the first support member 310 and the second point 322 of the second support member 320. The first point 312 and the second point 322 may be spaced apart so as not to be both disposed on the same line 620 parallel to the central axis 330.

For example, when the first point 312 is positioned on the straight line 620 parallel to the central axis 330, the second point 322 of the connecting member 340 is positioned on the second support member 320 at a location other than the point 610 where the line 620 intersects the second support member 320.

To the extent that the descriptions provided with reference to FIGS. 1 through 5 are also applicable to FIG. 6, they are not repeated in the interest of conciseness.

Figure 7:
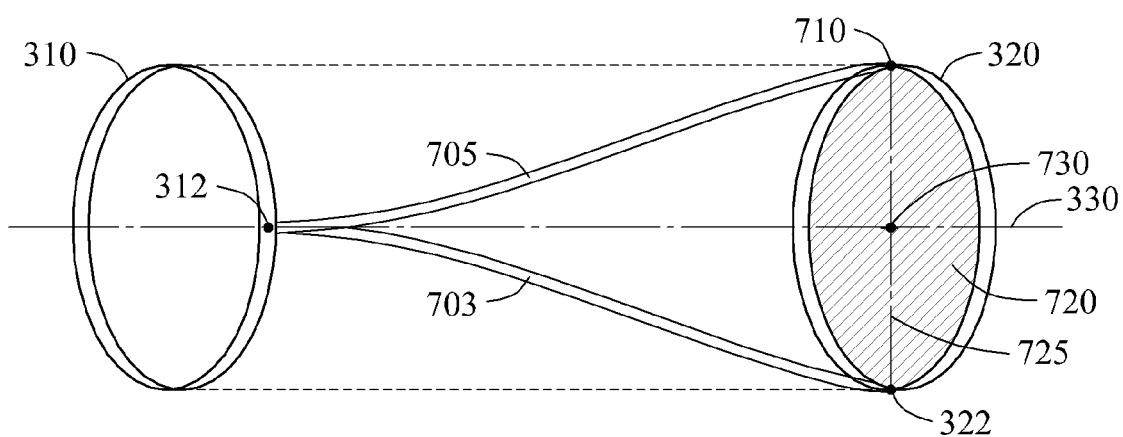
FIG. 7 is a perspective view illustrating another example of a receiving coil provided in a ring-type structure.

FIG. 7 is a perspective view that illustrates another example of a structure of a receiving coil using ring-type support members.

Referring to FIG. 7, a plurality of elements may be provided in the receiving coil 260, including a first support member 310 and a second support member 320 disposed around a central axis 330, a first coil element 703, and a second coil element 705.

The first and second coil elements 703 and 705 are helical in shape. For example, a tangent line at any point on the coil element forms a constant angle with the central axis 330. The elements 703 and 705 may be formed as helical shapes passing over a surface of a virtual right circular cylinder formed between the first support member 310 and the second support member 320 around the central axis 330.

The first coil element 703 is connected to the first point 312 of the first support member 310 and the second point 322 of the second support member 320. For example, the first element 703 may correspond to the coil element 340 described above.

The second coil element 705 is connected to the first point 312 of the first support member 310 and a third point 710 of the second support member. In one example, if a planer area 720 is formed by the area of a circle formed by the second support member 320 in a plane perpendicular to the central axis 330, then the position of the third point 710 on the support member is symmetrical in relation to the second point 322. For example, the third point 710 and the second point 322 are both located on a straight line 725 intersecting the center point 730 of the planar area 720.

To the extent that the descriptions provided with reference to FIGS. 1 through 6 are also applicable to FIG. 7, they are not repeated in the interest of conciseness.

Figure 8:
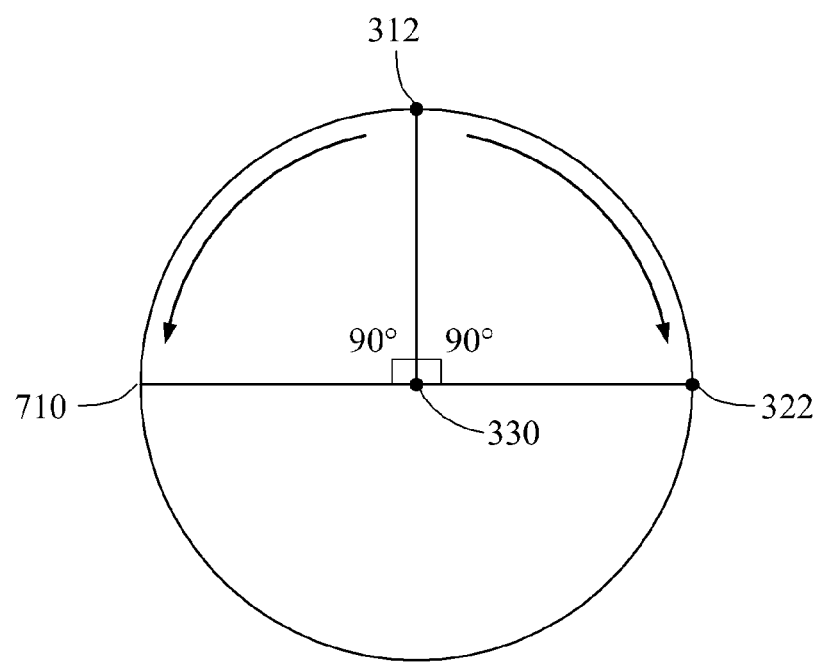
FIG. 8 is an end view illustrating another example of aligning a coil element.

FIG. 8 is an end view that illustrates another example of aligning a coil element. FIG. 8 illustrates the receiving coil 260 of FIG. 7 viewed from an end of the coil 260 in the direction down the central axis 330 of the coil between the first support member 310 and the second support member 320.

The first element 703 is connected to the first point 312 with the second point 322. The second element 705 is connected to the first point 312 and the third point 710. As shown in FIG. 8, the angle formed between the first point 312, the central axis 330, and the second point 322 is 90°. The angle between the first point 312, the central axis 330, and the third point 710 is 90°.

To the extent that the descriptions provided with reference to FIGS. 1 through 7 are also applicable to FIG. 8, they are not repeated in the interest of conciseness.

Figure 9:
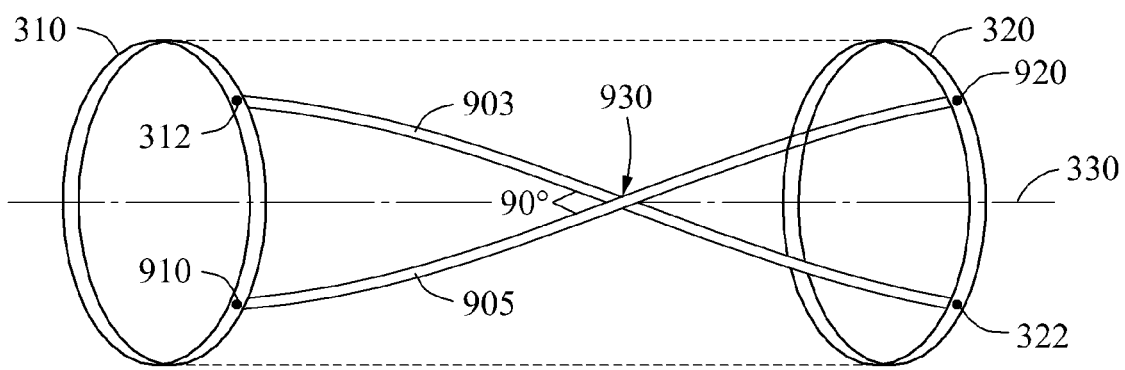
FIG. 9 is a perspective view illustrating another example of a receiving coil provided in a ring-type structure.

FIG. 9 is a perspective view that illustrates yet another example of a structure of a receiving coil using ring-type support members. Referring to FIG. 9, a plurality of elements may be provided in the receiving coil 260 including a first support member 310 and a second support member 320 disposed around a central axis 330, a first coil element 903, and a second coil element 905. The first and second coil elements 903 and 905 are helical in shape. For example, a tangent line at any point on the coil element forms a constant angle with the central axis 330. The coil elements 903 and 905 may be formed as helical shapes passing over a surface of a virtual right circular cylinder formed between the first support member 310 and the second support member 320 around the central axis 330.

The first coil element 903 is connected to the first point 312 on the first support member 310 and the second point 322 on the second support member 320. For example, the first coil element 903 may correspond to the coil element 340 described above.

The second coil element 905 is connected to a third point 910 of the first support member 310 and a fourth point 920 of the second support member 320. The first coil element 903 and second coil element 905 are positioned on the surface of a virtual cylinder formed between the first support member 310 and the second support member 320 around the central axis 330 to symmetrically cross at a point 930. For example, if the virtual right circular cylinder formed by the support members is sliced in half along the plane intersecting the central axis and point 930, the two halves formed are mirror images of each other. In addition, when the coil element 903 and the coil element 905 symmetrically cross, the angle of intersection at point 930 may be 90°. For example, the coil element 903 and 905 may be orthogonal to one another at point 930. Since the coil elements 903 and 905 are aligned to perpendicularly cross each other, a channel may not affect another channel.

The plurality of coil elements 903 and 905 are electrically insulated from one another. As an example, a spatial gap may exist in an area between the first coil element 903 and the second element coil 905 where the first element coil 903 and the second element coil 905 cross on the surface of the virtual cylinder. As another example, the plurality of coil elements 903 and 905 may be electrically insulated from one another using an insulating material.

In an example, the first point 312 and the fourth point 920 are positioned on the support members such that a line parallel to the central axis 330 can intersect both points. Similarly, the second point 322 and the third point 910 are positioned on the support members such that a line parallel to the central axis 330 can intersect both points.

To the extent that the descriptions provided with reference to FIGS. 1 through 8 are also applicable to FIG. 9, they are not repeated in the interest of conciseness.

Figure 10:
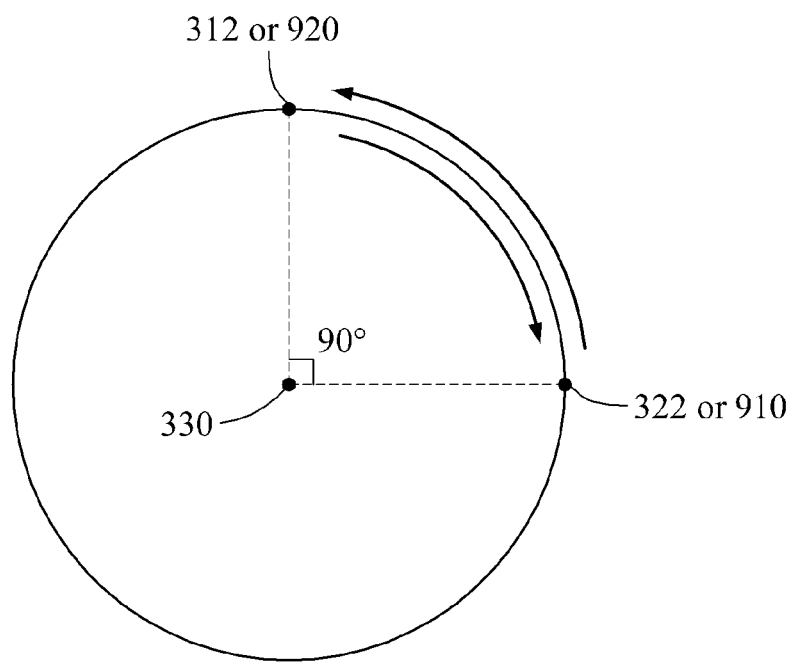
FIG. 10 is an end view illustrating another example of aligning a coil element.

FIG. 10 end view that illustrates still another example of aligning coil elements.

FIG. 10 illustrates the receiving coil 260 of FIG. 9 viewed from one end in the direction down the central axis 330 from the first support member 310 to the second support member 320.

The first coil element 903 is connected to the first point 312 and the second point 322 on the support members. The second coil element 905 is connected to the third point 910 and the fourth point 920 on the support members.

As shown in FIG. 10, the angle formed between the first point 312, the central axis 330, and the second point 322 is 90°, and the angle formed between the third point 910, the central axis, and the fourth point 920 is 90°.

To the extent that the descriptions provided with reference to FIGS. 1 through 9 are also applicable to FIG. 10, they are not repeated in the interest of conciseness.

Figure 11:
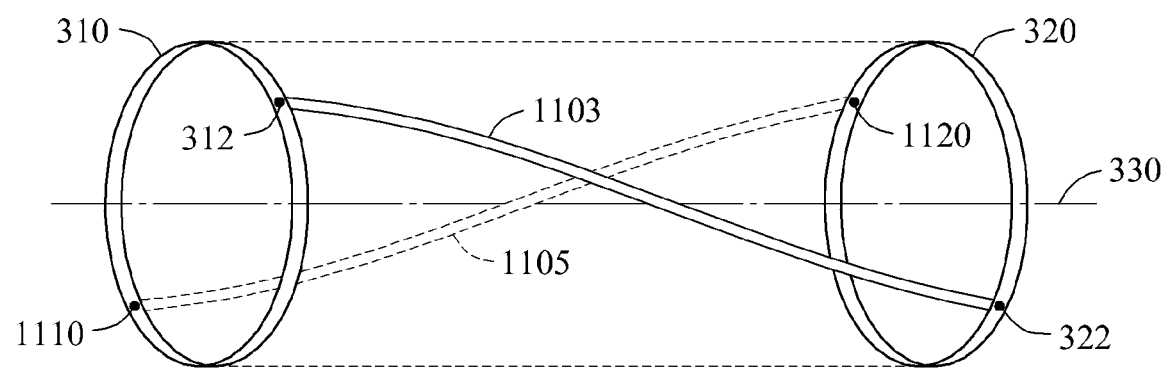
FIG. 11 is a perspective view illustrating another example of a receiving coil provided in a ring-type structure.

FIG. 11 is a perspective view that illustrates yet another example of a structure of a receiving coil using ring-type support members.

Referring to FIG. 11, a plurality of elements may be provided in the receiving coil 260 including a first support member 310 and a second support member 320 disposed around a central axis 330, a first coil element 1103, and a second coil element 1105. The first and second elements 1103 and 1105 are helical in shape. For example, a tangent line at any point on the coil element forms a constant angle with the central axis 330. The coil elements 1103 and 1105 may be formed as a helical shape passing over a surface of a virtual right circular cylinder formed between the first support member 310 and the second support member 320 around the central axis 330.

The first coil element 1103 is connected to the first point 312 on the first support member 310 and the second point 322 on the second support member 320. For example, the first coil element 1103 may correspond to the element 340 described above.

The second coil element 1105 is connected to a third point 1110 on the first support member 310 and a fourth point 1120 on the second support member 320.

The first coil element 1103 and second coil element 1105 are positioned on the surface of a virtual cylinder formed between the first support member 310 and the second support member 320 around the central axis 330 to symmetrically cross with respect to the central axis 330. For example, a line drawn from the first point 312 through the center of the ring forming the first support member 310 intersects the third point 1110. Similarly, a line drawn from the second point 322 through the center of the ring formed by the second support member 310 intersects the fourth point 1120.

To the extent that the descriptions provided with reference to FIGS. 1 through 10 are also applicable to FIG. 11, they are not repeated in the interest of conciseness.

Figure 12:
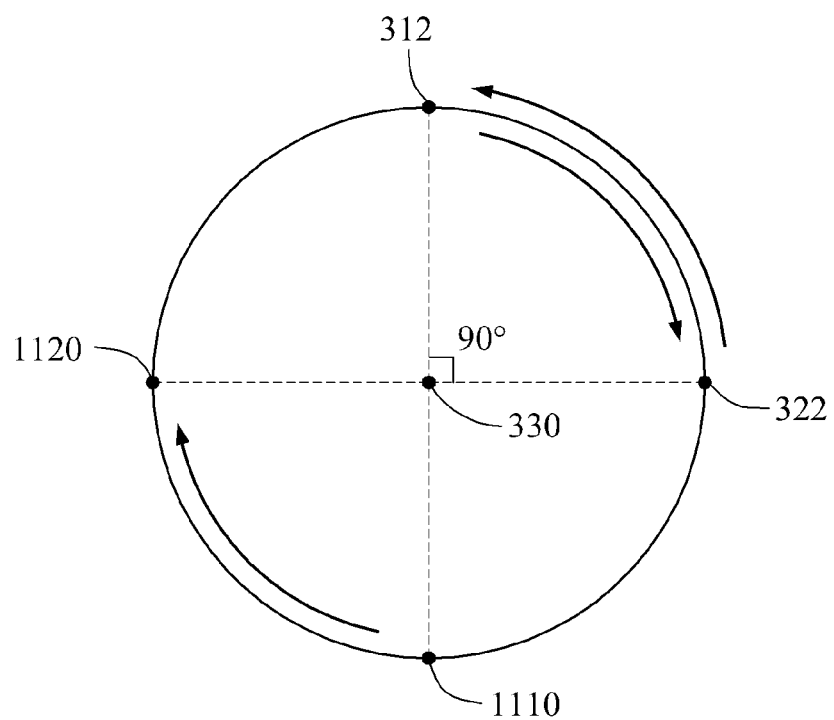
FIG. 12 is an end view illustrating another example of aligning a coil element.

FIG. 12 is an end view that illustrates yet another example of aligning coil elements. FIG. 12 illustrates the receiving coil 260 of FIG. 11 viewed from and end in a direction down the central axis 330 between the first support member 310 and the second support member 320.

The first coil element 1103 is connected to the first point 312 and the second point 322 on the support members. The second coil element 1105 is connected to the third point 1110 and the fourth point 1120 on the support members. As shown in FIG. 12, the angle formed between the first point 312, the central axis 330, and the second point 322 is 90°, and the angle formed between the third point 1110, the central axis 330, and the fourth point 1120 is 90°. In addition, the angle formed between the first point 312, the central axis 330, and the third point 1110 is 180°, and the angle formed between the second point 332, the central axis 330, and the fourth point 1120 also is 180°.

To the extent that the descriptions provided with reference to FIGS. 1 through 11 are also applicable to FIG. 12, they are not repeated in the interest of conciseness.

Figure 13:
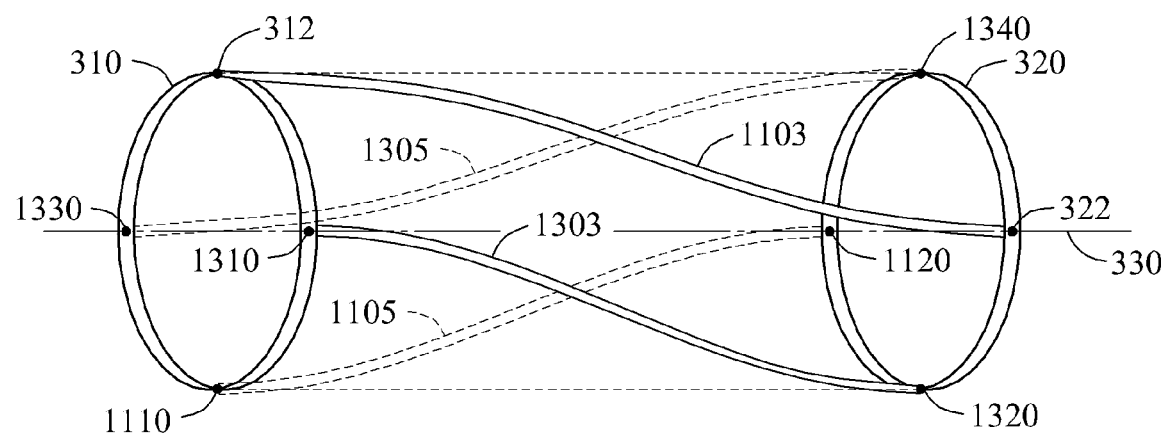
FIG. 13 is a perspective view illustrating further another example of a receiving coil provided in a ring-type structure.

FIG. 13 is a perspective view that illustrates yet another example of a structure of a receiving coil using ring-type support members.

Referring to FIG. 13, the receiving coil 260 of FIG. 11 may further include a third coil element 1303 and a fourth coil element 1305. The third and fourth coil elements 1303 and 1305 also are helical in shape. For example, a tangent line at any point on the coil element forms a constant angle with the central axis 330. The elements 1303 and 1305 may be formed as a helical shape passing over the surface of the virtual right circular cylinder formed between the first support member 310 and the second support member 320 around the central axis 330.

The third coil element 1303 is connected to a fifth point 1310 on the first support member 310 and a sixth point 1320 on the second support member 320. The fourth coil element 1305 is connected to a seventh point 1330 on the first support member 310 and an eighth point 1340 on the second support member 320.

The third coil element 1303 and fourth coil element 1305 are positioned on the surface of the virtual cylinder formed between the first support member 310 and the second support member 320 around the central axis 330 to symmetrically cross with respect to the central axis 330. Each of the third coil element 1303 and the fourth coil element 1305 may be disposed between the first coil element 1103 and the second coil element 1104 on the surface of the virtual cylinder. For example, a line drawn from the fifth point 1310 through the center of the ring forming the first support member 310 intersects the seventh point 1330. Similarly, a line drawn from the sixth point 1320 through the center of the ring formed by the second support member 310 intersects the eighth point 1340.

To the extent that the descriptions provided with reference to FIGS. 1 through 12 are also applicable to FIG. 13, they are not repeated in the interest of conciseness.

Figure 14:
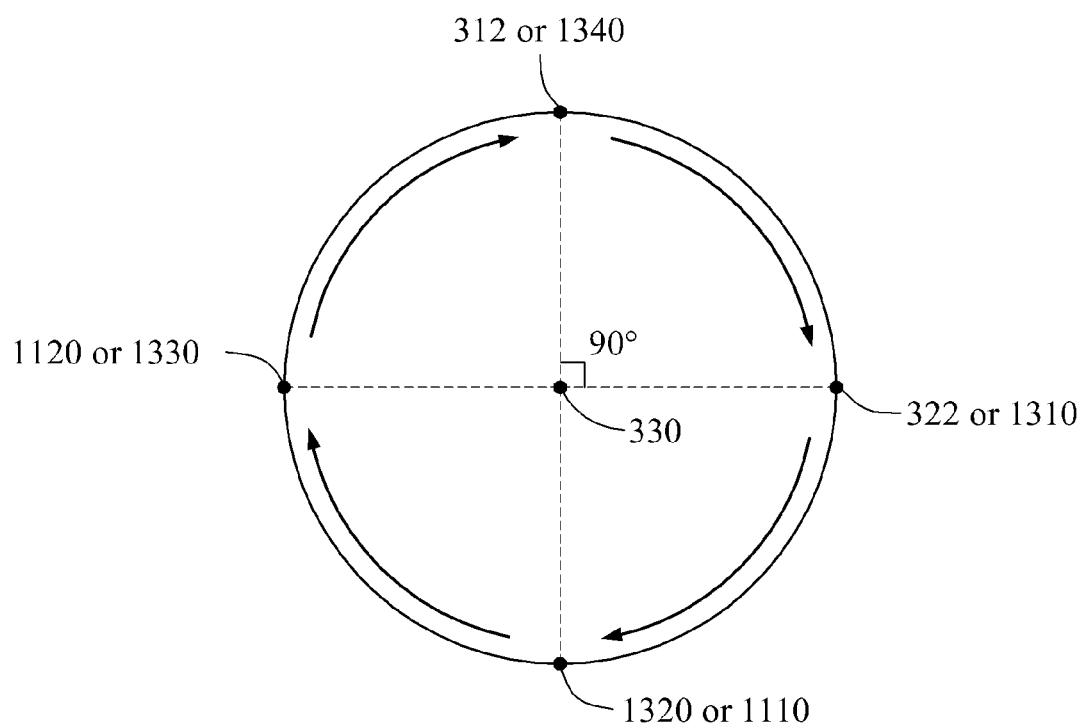
FIG. 14 is an end view illustrating another example of aligning a coil element.

FIG. 14 is an end view that illustrates yet another example of aligning coil elements. FIG. 14 illustrates the receiving coil 260 of FIG. 13 viewed from an end in a direction down the central axis 330 between the first support member 310 and the second support member 320.

The first coil element 1103 is connected to the first point 312 and the second point 322 of the support members. The second coil element 1105 is connected to the third point 1110 and the fourth point 1120 of the support members. The third coil element 1303 is connected to the fifth point 1310 and the sixth point 1320 of the support members. The fourth coil element 1305 is connected to the seventh point 1330 and the fourth point 1340 of the support members.

As shown in FIG. 14, the angle formed between the first point 312, the central axis 330, and the second point 322 is 90°, and the angle formed between the third point 1110, the central axis 330, and the fourth point 1120 is 90°. In addition, the angle formed between the first point 312, the central axis 330, and the third point 1110 is 180°, and the angle formed between the second point 332, the central axis 330, and the fourth point 1120 also is 180°. Furthermore, the angle formed between the fifth point 1310, the central axis 330, and the sixth point 1320 is 90°, and the angle formed between the seventh point 1330, the central axis 330, and the eighth point 1340 is 90°. In addition, the angle formed between the fifth point 1310, the central axis 330, and the seventh point 1330 is 180°, and the angle formed between the sixth point 1320, the central axis 330, and the eight point 1340 also is 180°.

To the extent that the descriptions provided with reference to FIGS. 1 through 13 are also applicable to FIG. 14, they are not repeated in the interest of conciseness.

Figure 15:
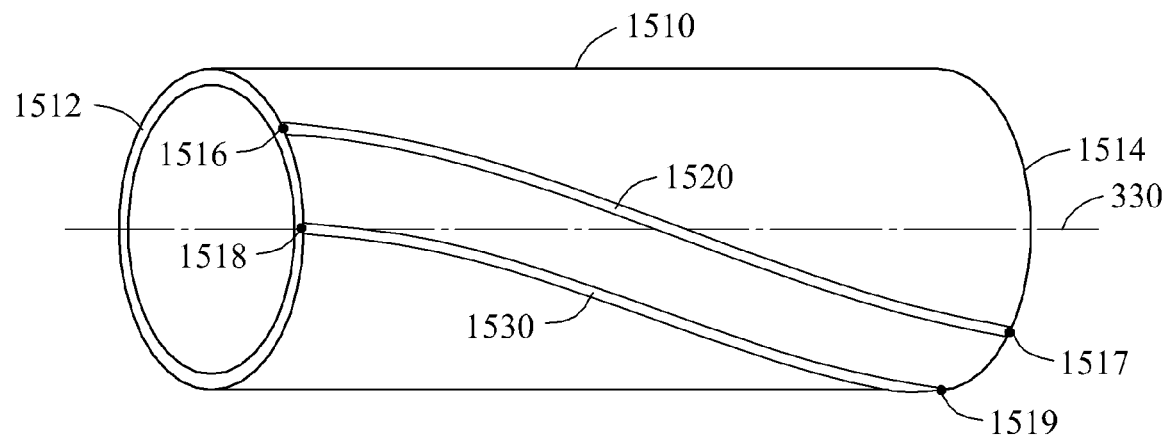
FIG. 15 is a perspective view illustrating an example of a receiving coil provided in a cylinder-type structure.

FIG. 15 is a perspective view that illustrates an example of a receiving coil provided in a cylinder-type structure. The receiving coil 260 includes a support member 1510 formed as a wall of a cylinder structure formed at a constant radius r around and parallel to a central axis 330 of the cylinder structure of which both ends are open. At each end of the cylindrical support member 1510 is a first side surface 1512 and a second side surface 1514. In one example, the support member 1510 may be formed out of a light-weight, corrosion-resistant, moldable material. For example, the support member 1510 may include fiber reinforced plastics (FRP) composites. In addition, the support member 1510 may be formed as non-conductor.

An at least one coil element, for example, coil element 1520 connects a first point 1516 of the support member 1510 via the exterior surface of the support member 1510 of the receiving coil 260 to a second point 1517 of the support member 1510. In another example, the coil element may be positioned using the interior surface of the support member 1510 of the receiving coil 260.

The first points 1516 are positioned at the first side surface 1512, and the second points 1517 are positioned at the second side surface 1514.

As shown in FIG. 15, the coil elements 1520, the first points 1516, and the second points 1517 may correspond to the coil elements 340, the first points 312, and the second points 322 of FIGS. 3 and 6, respectively. For example, descriptions provided with reference to the coil elements 340, the first points 312, and the second points 322 of FIG. 3 may be applied with respect to the elements 1520, the first points 1516, and the second points 1517 and therefore are not repeated.

In addition, to the extent that the descriptions provided with reference to FIGS. 1 through 14 are also applicable to FIG. 15, they are not repeated in the interest of conciseness.

Figure 16:
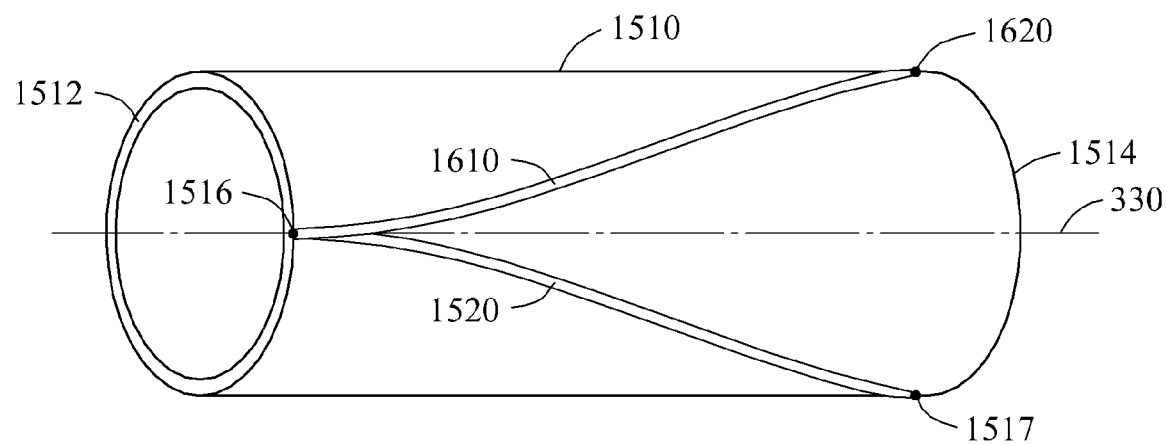
FIG. 16 is a perspective view illustrating another example of a receiving coil provided in a cylinder-type structure.

FIG. 16 is a perspective view that illustrates another example of a receiving coil provided in a cylinder-type structure. As shown in FIG. 16, the receiving coil 260 includes a cylindrical support member 1510, having a first side surface 1512 and second side surface 1514, a first coil element 1520, and a second coil element 1610.

The second coil element 1610 connects the first point 1516 of the support member 1510 of the receiving coil 260 via the exterior surface of the support member 1510 to a third point 1620 of the support member 1510 positioned at the second side surface 1514. In another example, the coil element 1610 may be positioned using the interior surface of the support member 1510 of the receiving coil 260.

The first point 1516, the third point 1620, the first coil element 1520, and the second coil element 1610 correspond to the first point 312, the third point 710, the first coil element 703, and the second coil element 705 of FIGS. 7 and 8, respectively. For example, descriptions provided with reference to the first point 312, the third point 710, the second coil element 703, and the second coil element 705 of FIG. 7 may be applied with respect to the first point 1516 the third point 1620, the first coil element 1520, and the second coil element 1610 and therefore are not repeated.

In addition, to the extent that the descriptions provided with reference to FIGS. 1 through 15 are also applicable to FIG. 16, they are not repeated in the interest of conciseness.

Figure 17:
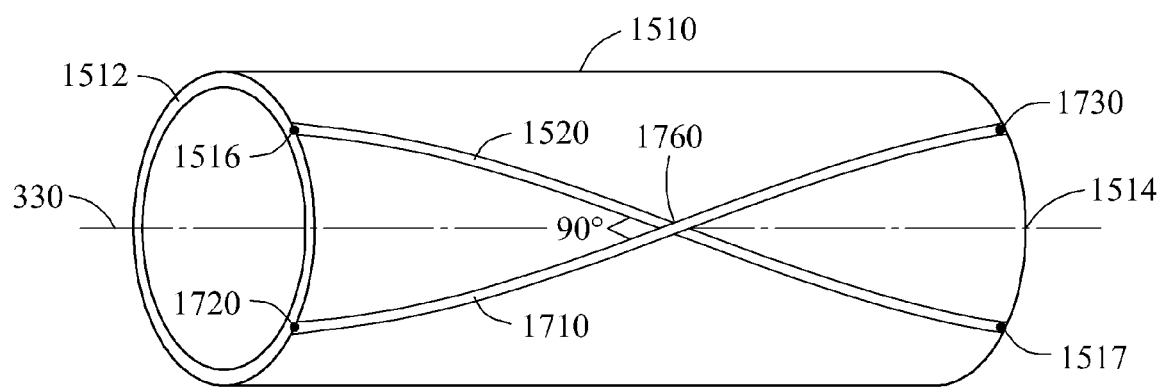
FIG. 17 is a perspective view illustrating another example of a receiving coil provided in a cylinder-type structure.

FIG. 17 is a perspective view that illustrates yet another example of a receiving coil provided in a cylinder-type structure. As shown in FIG. 17, the receiving coil 260 includes the cylindrical support member 1510, having the first side surface 1512 and the second side surface 1514, the first coil element 1520, and a second coil element 1710.

The second coil element 1710 connects a third point 1720 of the support member 1510 of the receiving coil 260 positioned at the first side of the surface 1512 via the exterior surface of the support member 1510 and a fourth point 1730 of the support member 1510 positioned at the second side surface 1514 symmetrically cross at a point 1760. For example, if the right circular cylinder formed by the support member 1510 is sliced in half along the plane intersecting the central axis 330 and point 1760, the two halves formed are mirror images of each other. In addition, when the coil element 1520 and the coil element 1710 symmetrically cross, the angle of intersection at point 1760 may be 90°. For example, the coil element 1520 and 1710 may be orthogonal to one another at point 1760. In another example, the coil element 1710 may be positioned using the interior surface of the support member 1510 of the receiving coil 260. Since the coil elements 1520 and 1710 are aligned to perpendicularly cross each other, a channel may not affect another channel.

The first point 1516, the second point 1517, the third point 1720, the fourth point 1730, the first coil element 1520, and the second coil element 1710 correspond to the first point 312, the second point 322, the third point 910, the fourth point 920, the first coil element 903, and the second coil element 905 of FIGS. 9 and 10, respectively. For example, the descriptions provided with reference to the first point 312, the second point 322, the third point 910, the fourth point 920, and the first coil element 903, and the second coil element 905 of FIG. 9 may be applied with respect to the first point 1516, the second point 1517, the third point 1720, the fourth point 1730, the first coil element 1520, and the second coil element 1710, and are therefore not repeated.

To the extent that the descriptions provided with reference to FIGS. 1 through 16 are also applicable to FIG. 17, they are not repeated in the interest of conciseness.

Figure 18:
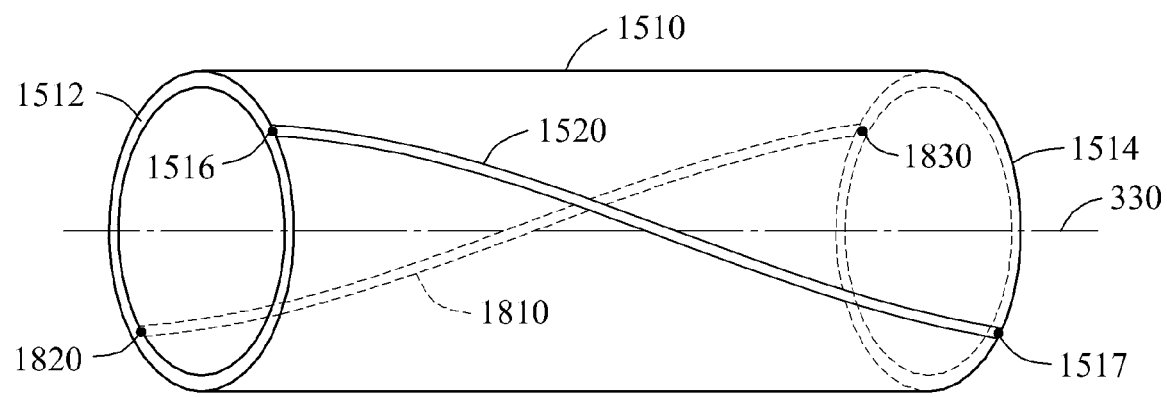
FIG. 18 is a perspective view illustrating another example of a receiving coil provided in a cylinder-type structure.

FIG. 18 is a perspective view that illustrates yet another example of a receiving coil provided in a cylinder-type structure. As shown in FIG. 18, the receiving coil 260 includes the cylindrical support member 1510, having the first side surface 1512 and the second side surface 1514, the first coil element 1520, and a second coil element 1810.

The second coil element 1810 connects a third point 1820 of the support member 1510 of the receiving coil 260 positioned at the first side of the surface 1512 via the exterior surface of the support member 1510 and a fourth point 1830 of the support member 1510 positioned at the second side surface 1514. In another example, the coil element 1810 may be positioned using the interior surface of the support member 1510 of the receiving coil 260.

The first point 1516, the second point 1517, the third point 1820, the fourth point 1830, the first coil element 1520, and the second coil element 1810 may correspond to the first point 312, the second point 322, the third point 1110, the fourth point 1120, the first coil element 1103, and the second coil element 1105 of FIG. 11, respectively. For example, the descriptions provided with reference to the first point 312, the second point 322, the third point 1110, the fourth point 1120, the first coil element 1103, and the second coil element 1105 of FIGS. 11 and 12 may be applied with respect to the first point 1516, the second point 1517, the third point 1820, the fourth point 1830, the first coil element 1520, and the second coil element 1810 may be replaced with the descriptions To the extent that the descriptions provided with reference to FIGS. 1 through 17 are also applicable to FIG. 18, they are not repeated in the interest of conciseness.

Figure 19:
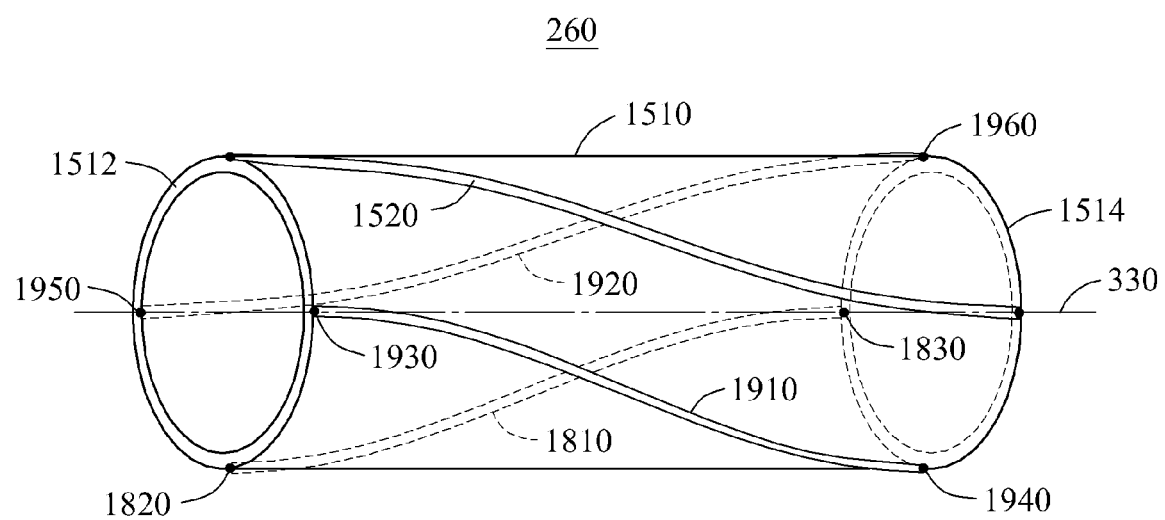
FIG. 19 is a perspective view illustrating another example of a receiving coil provided in a cylinder-type structure.

FIG. 19 is a perspective view that illustrates further another example of a receiving coil provided in a cylinder-type structure. As shown in FIG. 19, the receiving coil 260 includes the cylindrical support member 1510, having the first side surface 1512 and the second side surface 1514, the coil first element 1520, the second coil element 1810, a third coil element 1910 and a fourth coil element 1920. The third coil element 1910 connects a fifth point 1930 of the support member 1510 of the receiving coil 260 positioned at the first side of the surface 1512 via the exterior surface of the support member 1510 and a sixth point 1940 of the support member 1510 positioned at the second side surface 1514. The fourth coil element 1920 connects a seventh point 1950 of the support member 1510 of the receiving coil 260 positioned at the first side of the surface 1512 via the exterior surface of the support member 1510 and a eight point 1960 of the support member 1510 positioned at the second side surface 1514. In another example, the coil elements 1910 and 1920 may be positioned using the interior surface of the support member 1510 of the receiving coil 260.

The fifth point 1930, the sixth point 1940, the seventh point 1950, the eighth point 1960, the third element 1910, and the fourth element 1920 may correspond to the fifth point 1310, the sixth point 1320, the seventh point 1330, the eighth point 1340, the third element 1303, and the fourth element 1305 of FIGS. 13 and 14, respectively. For example, the descriptions provided with reference to the fifth point 1310, the sixth point 1320, the seventh point 1330, the eighth point 1340, the third element 1303, and the fourth element 1305 of FIGS. 13 and 14 with respect to the sixth point 1940, the seventh point 1950, the eighth point 1960, the third element 1910, and the fourth element 1920, and therefore are not repeated.

To the extent that the descriptions provided with reference to FIGS. 1 through 18 are also applicable to FIG. 19, they are not repeated in the interest of conciseness.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

Software or instructions executed a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A magnetic resonance imaging (MRI) receiving coil comprising:
    a first ring-shaped support member disposed around a central axis;
    a second ring-shaped support member disposed around the central axis;
    a first coil element disposed along a surface of a right circular virtual cylinder formed around the central axis between the first ring-shaped support member and the second ring-shaped support member, and connected to a first point on the first ring-shaped support member and a second point on the second ring-shaped support member; and
    a second coil element disposed along the surface of the right circular virtual cylinder, and connected to the first point on the first ring-shaped support member and a third point on the second ring-shaped support member,
    wherein the first and second coil elements have a helical shape such that a tangent line at any point on the first and second coil elements forms a constant angle with the central axis.

2. The MRI receiving coil of claim 1 further comprising capacitors forming connections between the first ring-shaped support member and the first and second coil elements, respectively, and between the second ring-shaped support member and the first and second coil elements, respectively.

3. The MRI receiving coil of claim 1, wherein the first and second coil elements are electrically insulated from each other.

4. The MRI receiving coil of claim 3, wherein the third point and the second point are symmetrical to each other in a planar area formed by an area surrounded by a second side surface of the second ring-shaped support member and perpendicular to the central axis.

* * * * *